(12) United States Patent
Stinson et al.

(10) Patent No.: US 6,553,545 B1
(45) Date of Patent: Apr. 22, 2003

(54) PROCESS PARAMETER EXTRACTION (75) Inventors: Jason C. Stinson, Mountain View, CA (US); Erik A. De La Iglesia, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 171 days.

(21) Appl. No.: 09/606,484

(22) Filed: Jun. 29, 2000

(51) Int. Cl.$^7$ ............................................. G06F 17/50
(52) U.S. Cl. ..................... 716/4; 716/1; 716/5
(58) Field of Search .............. 716/1–6, 18; 331/1 R, 331/2, 46, 108 C (56) References Cited

U.S. PATENT DOCUMENTS

| | | | | |
|---|---|---|---|---|
| 4,079,338 A | * | 3/1978 | Kronlage | 326/100 |
| 4,769,777 A | * | 9/1988 | Bittle et al. | 708/251 |
| 4,961,007 A | * | 10/1990 | Kumanoya et al. | 323/313 |
| 5,095,267 A | * | 3/1992 | Merrill et al. | 257/48 |
| 5,446,418 A | * | 8/1995 | Hara et al. | 331/108 B |
| 5,477,495 A | * | 12/1995 | Tanaka et al. | 365/185.13 |
| 5,706,218 A | * | 1/1998 | Hoffman | 331/78 |
| 5,877,651 A | * | 3/1999 | Furutani | 327/536 |
| 5,929,693 A | * | 7/1999 | Kuroda | 327/535 |
| 6,141,583 A | * | 10/2000 | Pape et al. | 607/16 |
| 6,211,727 B1 | * | 4/2001 | Carobolante | 323/282 |

\* cited by examiner

Primary Examiner—Matthew Smith
Assistant Examiner—Paul Dinh
(74) Attorney, Agent, or Firm—Trop, Pruner & Hu, P.C.

(57) ABSTRACT

An apparatus includes a test circuit, a first counter and a second counter. The test circuit is fabricated on a semiconductor substrate to generate an oscillating signal. The oscillating signal has a frequency that is dependent on at least in part a parameter of a process used to fabricate the test circuit. The first counter measures a time interval, and the second counter is coupled to the first counter to count a number of periods of the oscillating signal during the time interval.

22 Claims, 8 Drawing Sheets

PROCESS PARAMETER EXTRACTION

BACKGROUND

The invention relates to extracting process parameters.

For purposes of predicting the performance and characteristics of an integrated circuit, it is often desirable to measure certain parameters (called process parameters) that characterize the fabrication process that was used to fabricate the integrated circuit. Such parameters may indicate, for example, the influence that is exerted by the drain-depletion regions of n-channel and p-channel metal-oxide-semiconductor field-effect-transistors (MOSFETs) on the respective channels of these devices. The degree to which the channel of a particular MOSFET is influenced by its drain-depletion region is a measure of the strength and thus, the performance of the MOSFET.

For purposes of measuring, or extracting, process parameters from a particular silicon wafer, conventionally, test circuits, or structures, may be embedded in scribe lines that are located between the semiconductor dies in the wafer. Due to this arrangement, probes may be used to perform analog testing before the dies are cut and packaged to form the individual semiconductor packages, or chips. These test structures typically are destroyed in the cutting process. Because of time constraints, only structures between select dies may be tested.

Unfortunately, process parameters may vary across the wafer, and thus, the above-described analog testing techniques that are used before packaging may not be accurate enough to extract process parameters from particular dies. Furthermore, even if test structures are fabricated in a particular die, the die may not be able to be tested after packaging unless additional external pins are provided for purposes of performing the analog testing.

Thus, there is a continuing need for an arrangement and technique to address one or more of the problems that are stated above.

DETAILED DESCRIPTION

Figure 1:
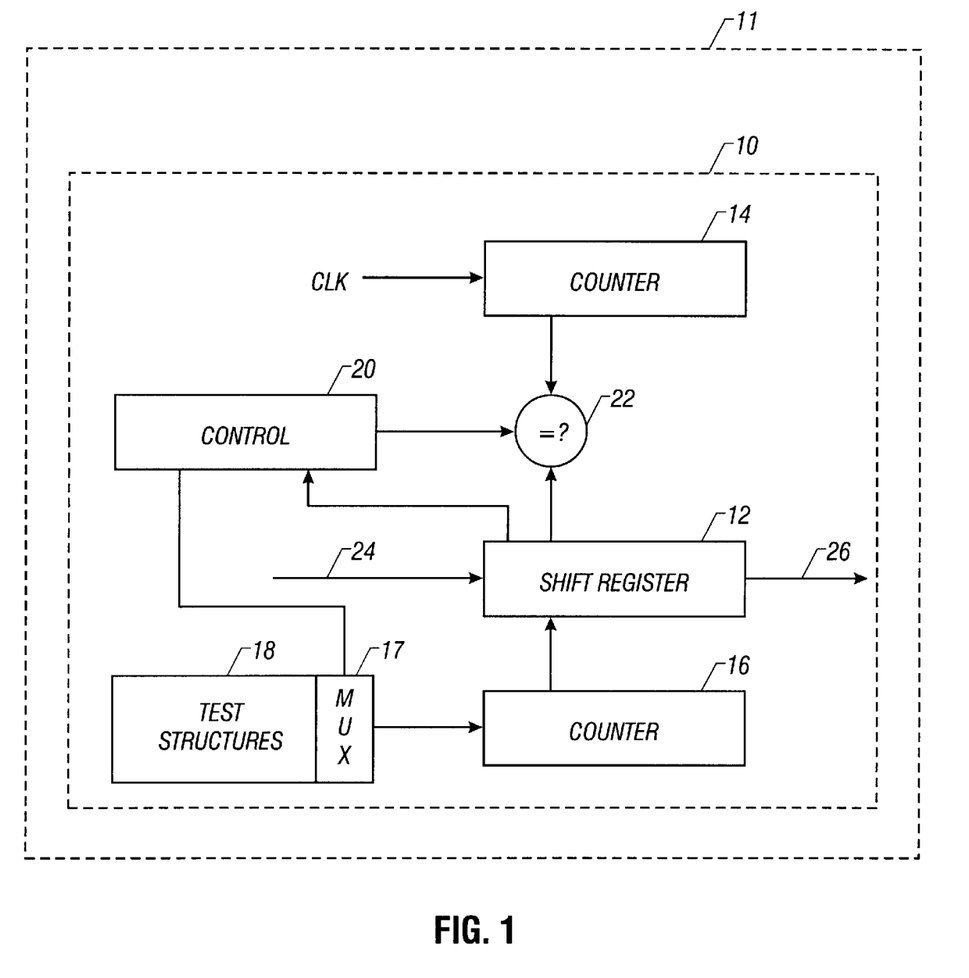
FIG. 1 is a schematic diagram of a system to extract process parameters according to an embodiment of the invention.

Referring to FIG. 1, an embodiment 10 of a process monitoring circuit in accordance with the invention may be fabricated in a die 11 for purposes of measuring, or extracting, process parameters that characterize the fabrication of integrated circuits in the die 11. Due to this arrangement, the circuit 10 may be used to extract process parameters even after packaging of the die 11. In some embodiments of the invention, the process monitoring circuit 10 may be a digital circuit that may use only a few output pins (two, for example) of a semiconductor package. As an example, these output pins may be pre-existing pins that are associated with a test interface.

By fabricating the process monitoring circuit 10 into the die, process metrics may be obtained from the die during the debugging or production of a particular integrated circuit. Therefore, for a wafer, the process monitoring circuit 10 may be fabricated into all dies of the wafer, thereby allowing all dies of the wafer to be tested. These tests may be performed, as an example, after the packaging of the dies. Furthermore, as described below, in some embodiments of the invention, the process monitoring circuit 10 may be used to extract process parameters from several regions of a particular die or several regions of a wafer. As can be appreciated from the description herein, the process monitoring circuit 10 permits simple correlation between process and debugging issues, such as speed paths, circuit marginalities, etc. Additionally, these process metrics may be measured with regards to voltage and temperature. By utilizing the extracting parameters at several die locations, indie variation may be gauged. As described below, in some embodiments of the invention, the circuit 10 may be used to characterize such effects as coupling, stacking and contention.

More particularly, in some embodiments of the invention, the process monitoring circuit 10 includes test circuits, or structures, 18, each of which is capable of generating an oscillating signal. In this manner, the frequency of the oscillating signal is influenced by the localized fabrication process (near the test structure 18) that is characterized by fabrication process parameters. Thus, by determining the frequency or frequencies of one or more of the test structures 18, the process monitoring circuit 10 may extract process parameters that characterize the fabrication process near the test structure(s) 18, as described below.

For purposes of measuring the frequencies and selecting the appropriate test structures 18, the process monitoring circuit 10 includes a shift register 12; two counters 14 and 16; decisional logic 22; a control state machine 20; and multiplexing circuitry 17. In some embodiments of the invention, the process monitoring circuit 10 may be used in the following manner to perform a test that includes selecting one of the test structures 18 and measuring the frequency of the oscillating signal that is provided by the selected test structure 18. First, an operator may furnish a signal (to an input terminal 24 of the shift register 12) that indicates a command (a word, for example) to be executed by the process monitoring circuit 10.

Figure 2:
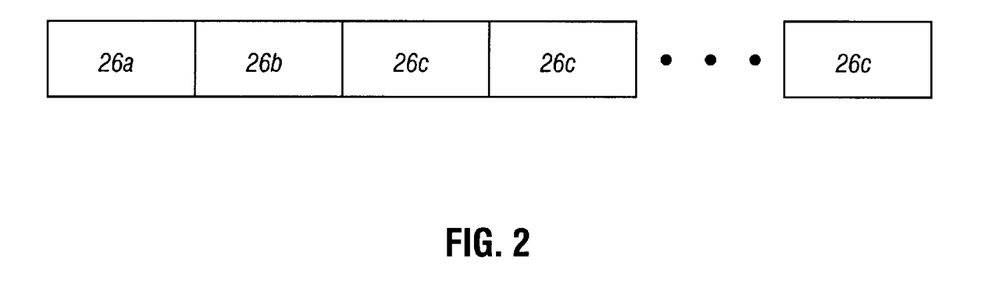
FIG. 2 is an illustration of a command for the system of FIG. 1 according to an embodiment of the invention.

FIG. 2 depicts an exemplary command 26 that may be loaded into the shift register 12.

The command 26 may include, as examples, a bit field 26a that identifies a particular test structure 18 to be used in the test, a bit field 26*b* that indicates the duration of the time interval that is used to conduct the test; and one or more bit fields 26*c* that may indicate, for example, debugging options to control visibility of internal nodes or experimental variables. After the command is loaded into the shift register 12, the multiplexing circuitry 17 (under the control of the control state machine 20) selects the test structure 18 that is identified by the command and the counter 14 is initialized to begin counting until the time interval that is specified by the command elapses. During this time interval, the counter 16 may be used to count the number of clock cycles of the oscillating signal. The control logic 20 uses the decisional logic 22 (that is coupled to the counter 14 and the shift register 12) to determine when the time interval elapses.

At the end of the time interval, the count that is stored by the counter 16 may be read and used to derive a frequency of the oscillating signal that is provided by the test structure 18. By analyzing the frequency or frequencies of the one or more test signals from the test structures 18, it may be determined how the different frequencies of the test structures are varying. In this manner, in some embodiments of the invention, each test structure 18 is sensitive to only specific process parameters. Thus, the test structures 18 may be used to extract discrete process parameters using simultaneous equations. More specifically, when the time interval elapses, the count that is stored in the counter 16 is loaded into the shift register 12 and shifted out to an output terminal 26 of the register 12. The shift register 12 may be incorporated, for example, into an existing test access port interface, with the terminals 24 and 26 being coupled to separate pins (for example) of the test access port interface. As an example, these pins may extend from a semiconductor package that encases the die 11.

Additional bits in the command that is stored in the shift register 12 may be used to vary conditions for the ring oscillators, such as noise or temperature. Control of the system may be synchronized to an external or internal clock signal to suit specific project needs.

In some embodiments of the invention, the test structures 18 may be arranged in groups, with each group being positioned at a different location in the die 11. Therefore, due to this arrangement, process parameters may be extracted from different regions of the same die 11.

Thus, the advantages of the process monitoring circuit 10 and the above-described techniques may include one or more of the following. Correlation may be made between process and debugging issues. Post-production examination of process parameters may be performed. An existing test access port interface may be used. Within die variation may be examined. Other and different advantages may be possible.

Figure 3:
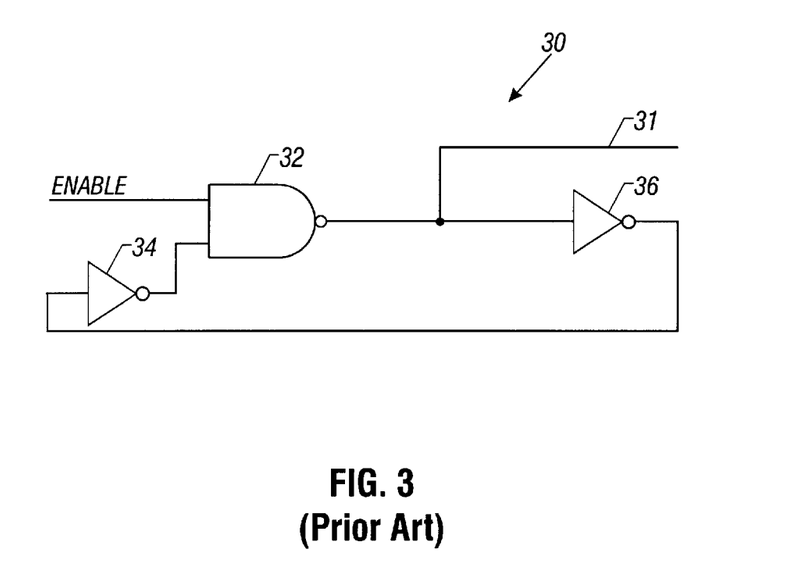
FIG. 3 illustrates a ring oscillator of the prior art.

As an example, the test structure 18 may include a ring oscillator in some embodiments of the invention. FIG. 3 depicts a ring oscillator 30 of the prior art. As shown in FIG. 3, the oscillator 30 includes a NAND gate 32 that serves as an enable gate to start and stop the generation of an oscillating signal that appears at an output terminal 31 of the NAND gate 32. One input terminal of the NAND gate 32 receives an oscillation enable signal (called Enable), and another input terminal of the NAND gate 32 is coupled to an output terminal of an inverter 34. The input terminal of the inverter 34, in turn, is coupled to the output terminal of an inverter 36 that has its input terminal coupled to the output terminal of the NAND gate 32. Due to this arrangement, when the Enable signal is asserted (driven high, for example), the oscillator 30 is enabled and produces an oscillating square wave signal that has a duty cycle of approximately one-half and alternates between logic zero and logic one states. This oscillating signal appears at the output terminal 31 of the NAND gate 32. When the Enable signal is de-asserted (driven low, for example), the output terminal 31 remains asserted (driven high, for example) and thus, does not provide an oscillating signal.

Figure 4:
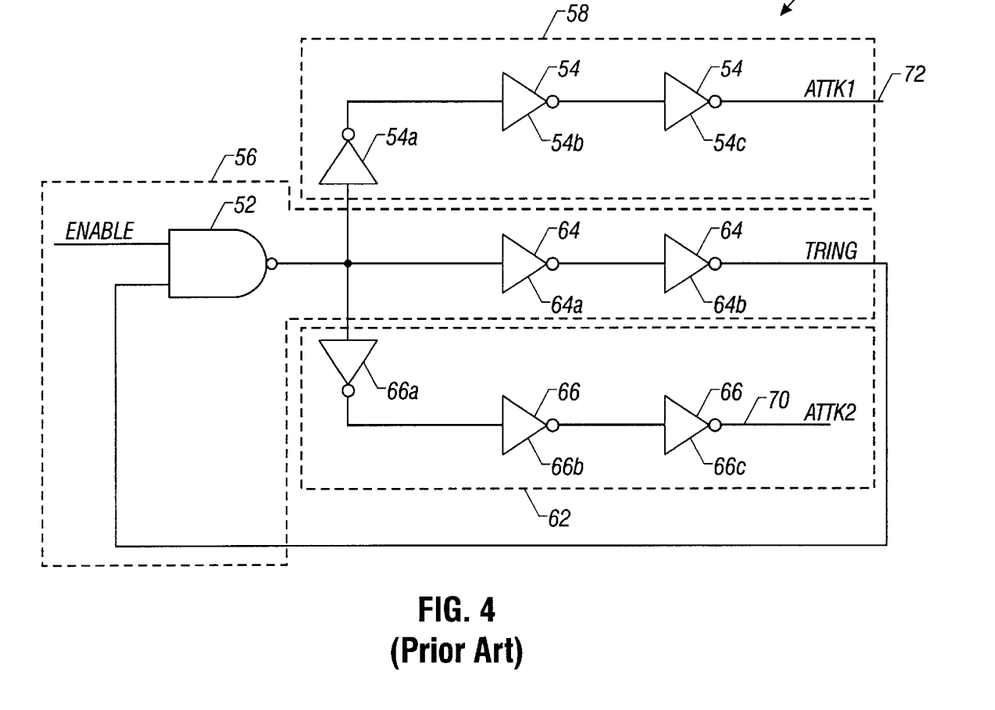
FIG. 4 depicts a test structure of the prior art.

The test structure 18 may include an arrangement 50 that is depicted in FIG. 4. The arrangement 50 includes a main testing oscillator 56 and adjacent circuits 58 and 62 called attackers. The attackers 58 and 62 are used to examine the effects of cross coupling on the main test ring oscillator 56. For example, the attackers 58 and 62 may be used to observe such effects as cross inductance coupling and cross capacitance coupling.

The ring oscillator 56 may be formed from two serially coupled inverters 64*a* and 64*b* and a NAND gate 52, similar to the design of the ring oscillator 30 that is depicted in FIG. 3. In this manner, the output terminal of the NAND gate 52 is coupled to an input terminal of the inverter 64*a*, the output terminal of the inverter 64*b*, and the output terminal of the other inverter 64*b* is coupled to an input terminal of the NAND gate 52. The other input terminal of the NAND gate 52 receives an oscillation enable signal.

Each attacker 58,62 produces an oscillating signal that propagates through the attacker 58, 62 such that, at any given point in the attacker 58,62, the oscillating signal at this point is ideally 180° out of phase with the oscillating signal that is produced at an adjacent point of the circuitry of the ring oscillator 56. In this manner, the attacker 58 may be formed from three serially coupled inverters 54*a*, 54*b* and 54*c*, with the input terminal of the inverter 54*a* being coupled to the output terminal of the NAND gate 52 to form the input terminal of the serial chain and the output terminal of the inverter 54*c* forming an output terminal of the attacker 58. The inverter 54*b* is adjacent to the inverter 64*a*, and the inverter 54*c* is adjacent to the inverter 64*b*. Thus, ideally, the signal at the output terminal of the inverter 64*a* should be 180° out of phase with the signal at the output terminal of the inverter 54*b*; and ideally, the signal at the output terminal of the inverter 64*b* should be 180° out of phase with the signal at the output terminal of the inverter 54*c*.

Similarly, the attacker 62 may be formed from three serially coupled inverters 66*a*, 66*b* and 66*c*, with the input terminal of the inverter 66*a* being coupled to the output terminal of the NAND gate 52 to form the input terminal of the serial chain and the output terminal of the inverter 66*c* forming an output terminal of the attacker 58. The inverter 66*b* is adjacent to the inverter 64*a*, and the inverter 66*c* is adjacent to the inverter 64*b*. Thus, ideally, the signal at the output terminal of the inverter 64*a* should be 180° out of phase with the signal at the output terminal of the inverter 66*b*; and ideally, the signal at the output terminal of the inverter 64*b* should be 180° out of phase with the signal at the output terminal of the inverter 66*c*.

Figure 5:
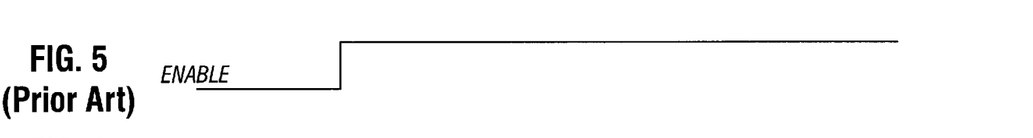
FIGS. 5, 6 and 7 depict waveforms of the ring oscillator of FIG. 4 of the prior art.
Figure 6:
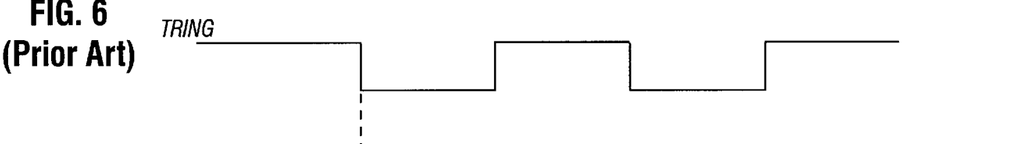
Figure 7:
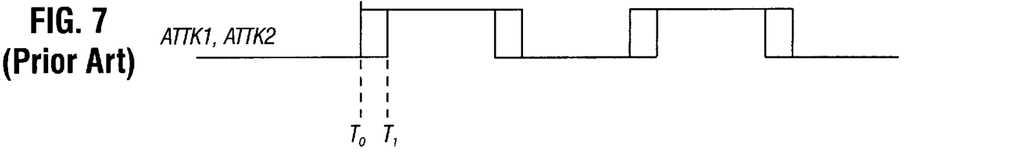

Unfortunately, because the main test oscillator ring and the attackers are formed from different numbers of inverters, the phase difference between the signal at a particular point in the attacker 58, 62 and the signal near the same point in the ring oscillator 56 typically is not 180°. In this manner, the signal that propagates through each attacker 58, 62 must propagate through three inverters that give rise to three propagation delays, and the signal that propagates through the ring oscillator 56 must propagate through two inverter and thus, incur one less propagation delay. Referring to FIGS. 5, 6 and 7, as an example of the possible nonsynchronization that may occur due to this arrangement, an output terminal 72 of the inverter 54c produces a signal (called ATTK1) that is depicted in FIG. 7; and the output terminal 70 of the inverter 66c produces a signal (called ATTK2) that is also depicted in FIG. 7. The inverter 54c and the inverter 66c are each adjacent to the inverter 64b (of the oscillator ring 56) that produces a signal (called TRING) at its output terminal. The TRING signal is depicted in FIG. 6. The generation of these oscillating signals is enabled when the Enable signal (see waveform in FIG. 5) is asserted at time $T_0$.

As depicted in FIGS. 5, 6 and 7, when the Enable signal is asserted time $T_0$, the edges of the TRING signal are not aligned with the edges of either the ATTK1 or the ATTK2 signal. For example, as depicted in FIGS. 6 and 7, at time $T_0$, the TRING signal transitions from a logic one level to a logic zero level. However, neither the ATTK1 nor the ATTK2 signal transitions from the logic zero to the logic one level until a slight time thereafter at time $T_1$ due to the propagation delay that is introduced by the additional inverter. The degree in which the attacker and test ring signals are misaligned from the ideal 180° arrangement, in turn, may affect the accuracy of the process parameter measurement.

Figure 8:
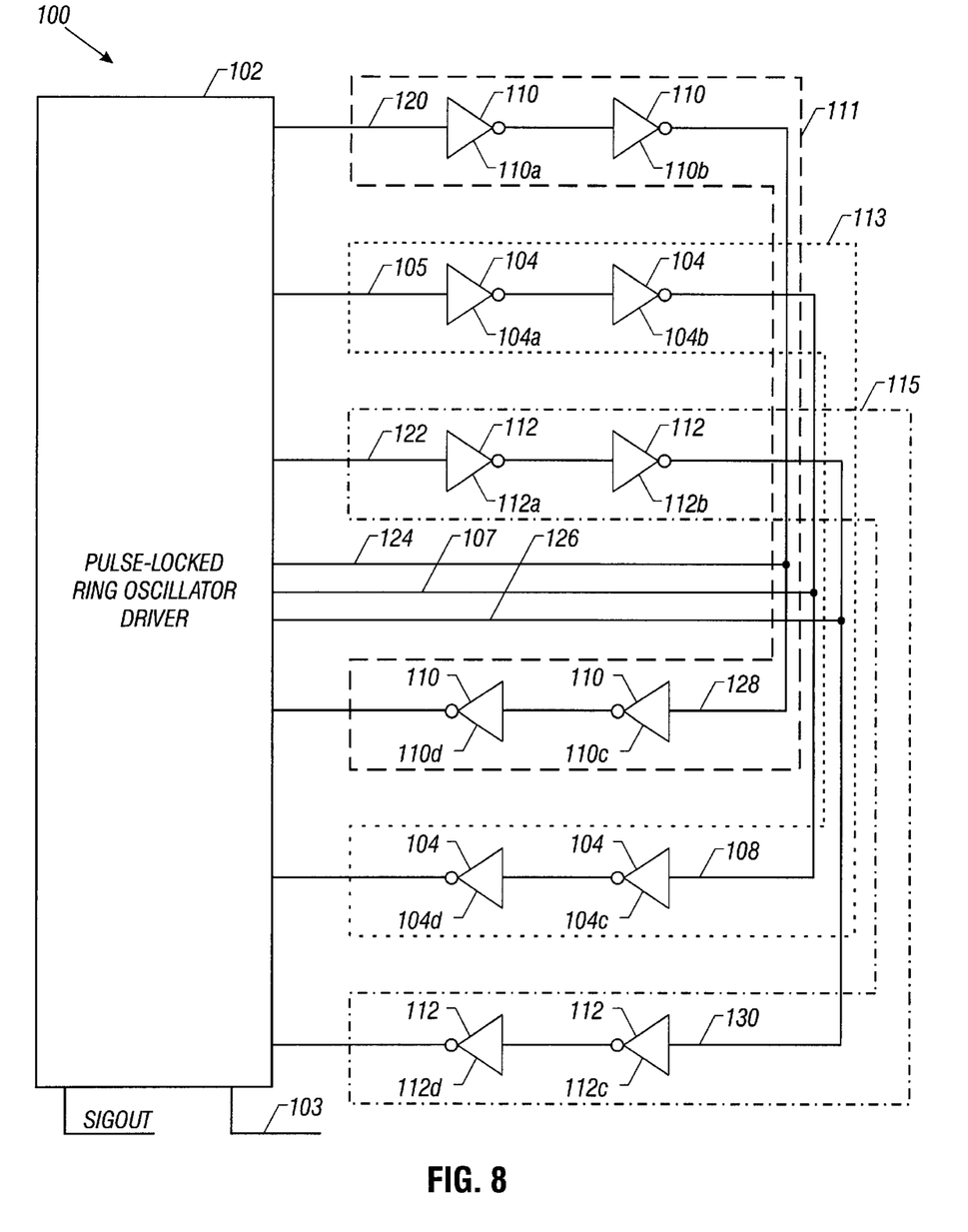
FIG. 8 is a schematic diagram of a system of ring oscillators and a ring oscillator driver according to an embodiment of the invention.

Referring to FIG. 8, for purposes of keeping the phase difference between adjacent points in adjacent circuits close to 180°, an embodiment 100 of a test structure in accordance with the invention includes a pulse-locked ring oscillator driver 102 to compensate for the difference in propagation delays that may otherwise exist. In this manner, the test structure 100 includes a main circuit 113 and two attacker circuits 111 and 115, all of which generating oscillating square signals (signals that each have a duty cycle of about one half, for example) that alternate between logic one and logic zero levels. Each attacker circuit 111, 115 includes components that are adjacent to corresponding components of the main circuit 113 and may be used to introduce cross coupling effects for purposes of testing.

As an example, in some embodiments of the invention, the main circuit 113 includes a chain of inverters 104a, 104b, 104c and 104d that are coupled between an output terminal 105 of the driver 102 and an input terminal 108 of the driver 102. In this manner, the input terminal of one of the inverters 104a is coupled to the output terminal 105. The output terminal of the inverter 104a, in turn, is coupled to the input terminal of the inverter 104b. The output terminal of the inverter 104b is coupled to an input terminal 107 of the driver 102 and is coupled to the input terminal of the inverter 104c. The output terminal of the inverter 104c is coupled to the input terminal of the inverter 104d, and the output terminal of the inverter 104d is coupled the input terminal 104.

The attacker circuit 111 may be formed from a chain of inverters 110a, 110b, 110c and 110d that are coupled between an output terminal 120 of the driver 102 and an input terminal 128 of the driver. In this manner, the input terminal of one of the inverters 110a is coupled to the output terminal 120. The output terminal of the inverter 110a, in turn, is coupled to the input terminal of the inverter 110b. The output terminal of the inverter 10b is coupled to an input terminal 124 of the driver 102 and is coupled to the input terminal of the inverter 110c. The output terminal of the inverter 110c is coupled to the input terminal of the inverter 110d, and the output terminal of the inverter 110d is coupled the input terminal 128.

The attacker circuit 115 may be formed from a chain of inverters 112a, 112b, 112c and 112d that are coupled between an output terminal 122 of the driver 102 and an input terminal 130 of the driver 102. In this manner, the input terminal of one of the inverters 112a is coupled to the output terminal 122. The output terminal of the inverter 112a, in turn, is coupled to the input terminal of the inverter 112b. The output terminal of the inverter 110b is coupled to an input terminal 126 of the driver 102 and is coupled to the input terminal of the inverter 112c. The output terminal of the inverter 112c is coupled to the input terminal of the inverter 112d, and the output terminal of the inverter 112d is coupled the input terminal 130.

As depicted in FIG. 8, in some embodiments of the invention, the inverter 104a (of the main circuit 113) is adjacent to the inverters 110a and 112a of the attacker circuits 111 and 115; the inverter 104b is adjacent to the inverters 110b and 112b of the attacker circuits 111 and 115; the inverter 104c is adjacent to the inverters 110c and 112c of the attacker circuits 111 and 115; and the inverter 104d is adjacent to the inverters 110d and 112d of the attacker circuits 111 and 115. As described below, the driver 102 regulates the oscillating signals that propagate through the circuits 111, 113 and 115 to cause the signal that propagates through the inverter 110a to be 180° out of phase with the signal that propagates through the inverter 104a; the signal that propagates through the inverter 112d to be 180° out of phase with the signal that is propagating through the inverter 104d; etc.

To accomplish this, the driver 102, in conjunction with each circuit 111, 113, 115, forms a ring oscillator out of each circuit 111, 113, 115. Thus, the driver 102 includes circuitry to form a ring oscillator out of the attacker circuit 111, includes circuitry to form a ring oscillator out of the attacker circuit 115, and includes circuitry to form a ring oscillator out of the main circuit 113. A conventional system may simply include an additional inverter in the feedback path of the main circuit 113 or in the feedback path of each attacker circuit 111, 115. However, this conventional arrangement (as depicted FIGS. 5, 6 and 7) may cause the edges of the oscillating signals to become offset with respect to each other in time. To avoid this problem, the driver 102 synchronizes the edges of the signals that are furnished at its output terminals 120, 105 and 122. Thus, in this manner, positive edges of the signal at the output terminal 105 (that is coupled to main circuit 113) occur concurrently with negative edges of the signals at the output terminals 120 and 122 (that are coupled to the attacker circuits 111 and 115); and negative edges of the signal at the output terminal 105 occur concurrently with positive edges of the signals at the output terminals 120 and 122.

Figure 9:
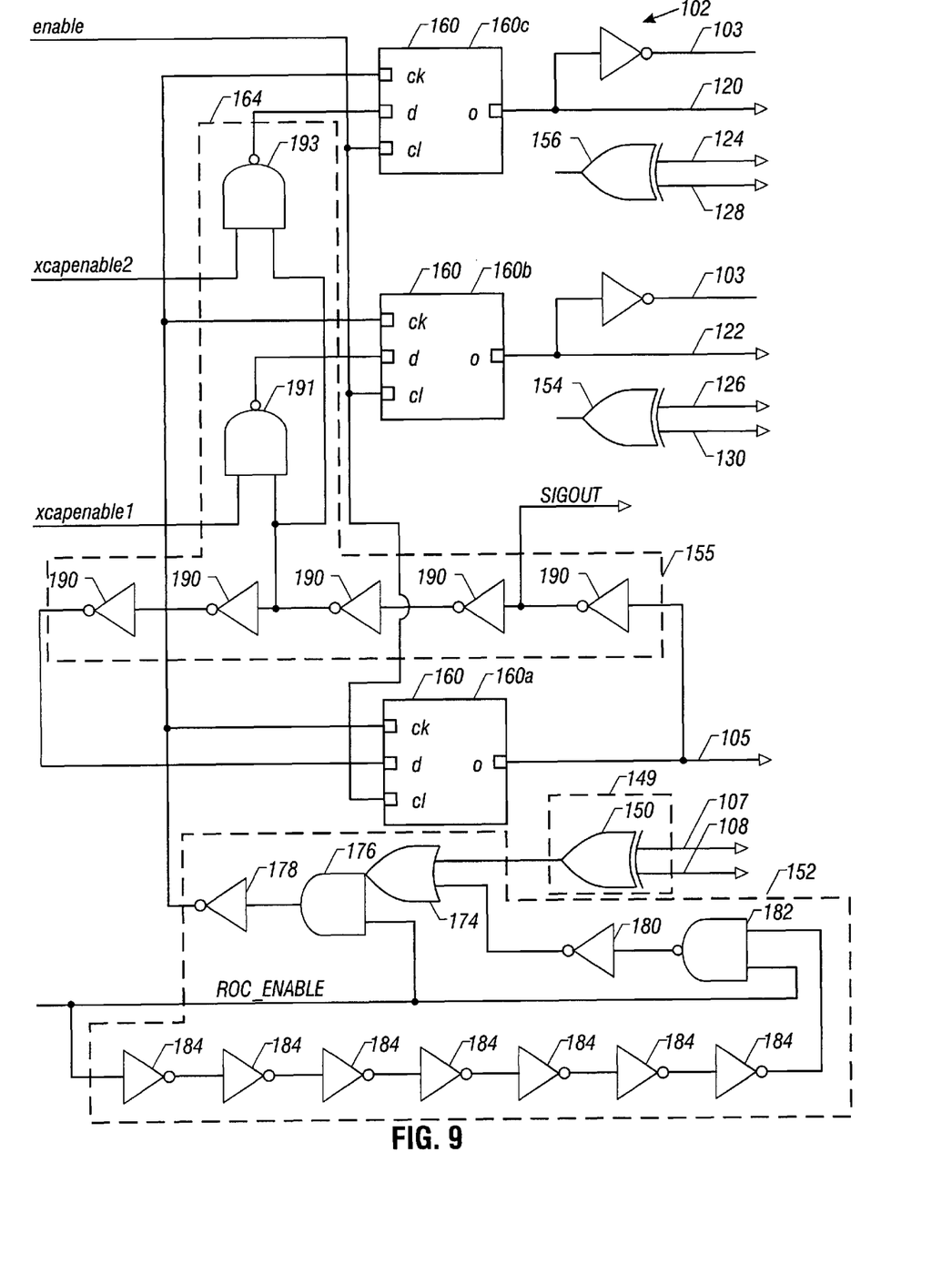
FIG. 9 is a schematic diagram depicting the ring oscillator driver of FIG. 8.

Referring to FIG. 9, in some embodiments of the invention, the pulse-locked ring oscillator driver 102 includes logic, such as an Exclusive OR (XOR) gate 150, that detects signal transitions, or edges, in the oscillating signal that propagates through the main circuit 113 and indicates when the edges occur. The XOR gate 150, in turn, is coupled to logic 152 that generates a clock signal in response to the XOR gate's detection of the signal edges. The logic 152, in turn, is coupled to the clock input of D-type flip-flops 160a, 160b and 160c that have their output terminals coupled to the output terminals 105, 122 and 120, respectively, of the driver 102. Thus, the flip-flops 160a, 160b and 160c are clocked in unison to concurrently furnish the edges of the appropriate signals to the circuits 113, 115 and 111, respectively.

The transition of the clock input terminals of the flip-flops 160 cause the flip-flops 160 to generate the next state of their respective ring oscillator signals. In this manner, the output terminal of the flip-flop 160a furnishes a signal to the output terminal 105, the flip-flop 160b furnishes an output terminal to the terminal 122, and the flip-flop 160c furnishes an output signal to the output terminal 120.

In some embodiments of the invention, the logic 152 includes a chain of serially coupled inverters 184 and an AND gate that is formed from a NAND gate 182 and an inverter 180 that has its input terminal coupled to the output terminal of the NAND gate 182. The first inverter 184 of the chain receives an Enable signal (called ROC_ENABLE) that is asserted (driven high, for example) to begin a time interval for measuring process parameters. As an example, the ROC_ENABLE signal may be provided by the counter 14 of the process monitoring circuit 10 (see FIG. 1). Once asserted, the logic zero-to logic one edge propagates through the chain of inverters 184 to reach one input terminal of the NAND gate 182. The other input terminal of the NAND gate 182 receives the ROC_ENABLE signal. The output terminal of the inverter 180 is coupled to one input terminal of an OR gate 174. Another input terminal of the OR gate 174 is coupled to the output terminal of the XOR gate 150. The output terminal of the OR gate is coupled to an input terminal of an AND gate 176, and another input terminal of the AND gate 176 receives the ROC_ENABLE signal. The output terminal of the AND gate 176, in turn, is coupled to the input terminal of an inverter 178 that has its output terminal coupled to the clock input terminals of the flip flops 160a, 160b and 160c.

Thus, due to the above-described arrangement, when the ROC_ENABLE signal is asserted, the logic 152 establishes a window, or time interval, for enabling the generation of the oscillating signals that propagate through the circuits 111, 113 and 115. During this time interval, the flip-flops 160a, 160b and 160c drive signals to the output terminals 105, 122 and 120, respectively, in synchronization.

For purposes of establishing the phase of the signals that are provided to the attacker circuits 111 and 115 180° out of phase with the signal that is provided to the circuit 113, in some embodiments of the invention, the driver 102 includes logic 164 that generates signals for the input terminals of the flip-flops 160a, 160b and 160c. As an example, in some embodiments of the invention, the logic 164 includes a chain of five inverters 190 that are coupled between the output terminal of the flip-flop 160a and the input terminal of the flip-flop 160a. The first inverter 190 of this chain provides a signal (called SIGOUT) that may be provided to, for example, the counter 16 of the process monitoring circuit 10 (see FIG. 1). The output terminal of the third inverter 190 of the chain provides a signal that may be used for purposes of generate input signals for the input terminals of the flip-flops 160b and 160c. The output terminal of the third inverter 190 in the chain is coupled to an input terminal of a NAND gate 191.

The other input terminal of the NAND gate 191 receives an enable signal (to selectively enable use of the attacker circuit 115), and the output terminal of the NAND gate 192 is coupled to the input terminal of the flip-flop 160b. The output terminal of the third inverter 190 is also coupled to the input terminal of a NAND gate 194. The other input terminal of the NAND gate 194 receives an enable signal (to selectively enable use of the attacker circuit 111), and the output terminal of the NAND gate 194 is coupled to the input terminal of the flip-flop 160c.

Among the other features of the pulse-locked ring oscillator driver 102, in some embodiments of the invention, the driver 102 includes additional XOR gates 154 and 156 to ensure that the loading on the attacker circuits 111 and 115 is the same as the loading on the main circuit 113. In this manner, the XOR gate 154 has its input terminals coupled to the input terminals 126 and 130 of the driver 102, and the input terminals of the XOR gate 156 are coupled to the terminals 124 and 128 of the driver 102. In some embodiments of the invention, for purposes of observing oscillating signals from the attacker circuits 111 and 115, the driver 102 includes inverters 103 that server as signal buffers to buffer the signals that are provided by the output terminals 120 and 122.

As described above, the attacker circuits communicate a signal that, near adjacent points of the main circuit, is approximately 180° out of phase with a signal that propagates through the main circuit. Such a phase relationship may be useful for purposes of evaluating capacitive coupling effects. However, other phase relationships may be established for purposes of measuring other effects. For example, in some embodiments of the invention, the phase relationship may be approximately 0° for purposes of evaluating inductive coupling effects. Other phase relationships are possible and are within the scope of the claims.

The following mathematical technique may be used by a number of similar ring oscillators, where each ring oscillator is susceptible to only specific process parameters and thus, can be used extract process metrics based on these parameters. In some embodiments, the below-described technique may be used in conjunction with the process monitoring circuit 10 of FIG. 1.

More particularly, in some embodiments of the invention, the test structures may include an elemental group 300 (see FIG. 10) of ring oscillators that form an elemental set to extract certain process parameters. For example, the elemental group 300 may include a group of ring oscillators 302 that are sensitive to p-channel device (i.e., a "p-device") and n-channel device (i.e., an "n-device") variations. Therefore, the frequencies of the signals that are produced by the ring oscillators 302 are sensitive to p-channel and n-channel device variations, as described above. Besides the elemental group 300 of ring oscillators 302, the test structures may also include a peripheral group 306 (see FIG. 11) of ring oscillators 308 that vary in response to the variation of other process parameters in which the oscillators 302 of the elemental group 300 do not vary. Dummy devices may be added to the ring oscillators of each group 300, 306 to ensure that all rings have identical input and self-loading capacitance.

In some embodiments of the invention, the elemental group 300 may include four different types of ring oscillators 302 that behave differently to the fabrication process. In this manner, the ring oscillator 302 that is labeled as "Ring A" in FIG. 10 may be sensitive to fabrication characteristics that influence the behavior of n-devices. These fabrication characteristics are referred to herein as "n-type process parameters." The Ring A ring oscillator 302 may be formed from one or more n-channel metal-oxide-semiconductor field-effect-transistors (NMOSFETs) whose performances are strongly influenced by drain-depletion regions of the NMOSFETs, as described below. The span of the drain-depletion region, in turn, may be a function of the n-device process parameters. Therefore, due to this influence, variations (in the fabrication process) that affects n-device process parameters also affect the oscillation frequency of ring oscillators that are formed from one or more of these NMOSFETs. In this manner, the oscillation frequency of a signal that is provided by a Ring A ring oscillator 302 indicates these n-device process parameters.

Figure 10:
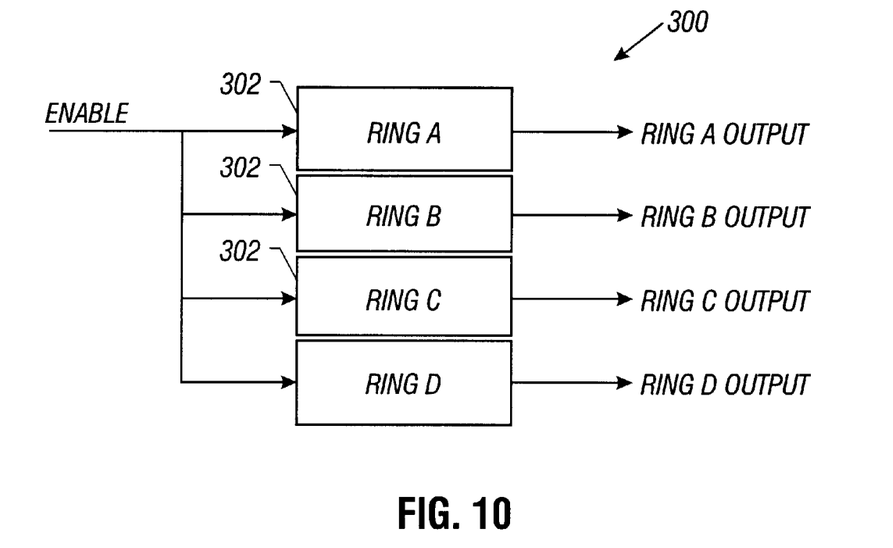
FIGS. 10 and 11 are schematic diagrams of test structures of the system of FIG. 1 according to embodiments of the invention.

Similarly, the ring oscillator 302 that is labeled as "Ring B" in FIG. 10 may be sensitive to fabrication characteristics that influence the behavior of p-devices. These characteristics may be represented by process parameters, referred to herein as "p-type process parameters." The ring oscillator 302 that is labeled as "Ring C" in FIG. 10 may be sensitive to fabrication characteristics that affect both p and n-device process parameters and thus, is sensitive to n-type and p-type process parameters; and the ring oscillator 302 that is labeled as "Ring D" in FIG. 10 is not sensitive to either n-type or p-type process parameters.

By comparing the frequencies of signals generated by the Ring A and Ring D ring oscillators 302, the relative n-device strength (i.e., an indication of the n-type process parameters) may be obtained. Similarly, by comparing the frequencies of the signals generated by Ring B and Ring D ring oscillators 302, the relative p-device strength (i.e., an indication of the p-type process parameters) may be obtained. Likewise, a comparison of the frequencies of the signals generated by the Ring A and Ring B ring oscillators 302 to the frequency of the signal generated by the Ring C ring oscillator 302 may be used to obtain a comparison of the n-type and p-type process parameters and thus, give the relative matching of the n-device and p-device strengths. This relative matching, in turn, may be used to normalize all the frequencies of the ring oscillators in the elemental group 300.

Figure 11:
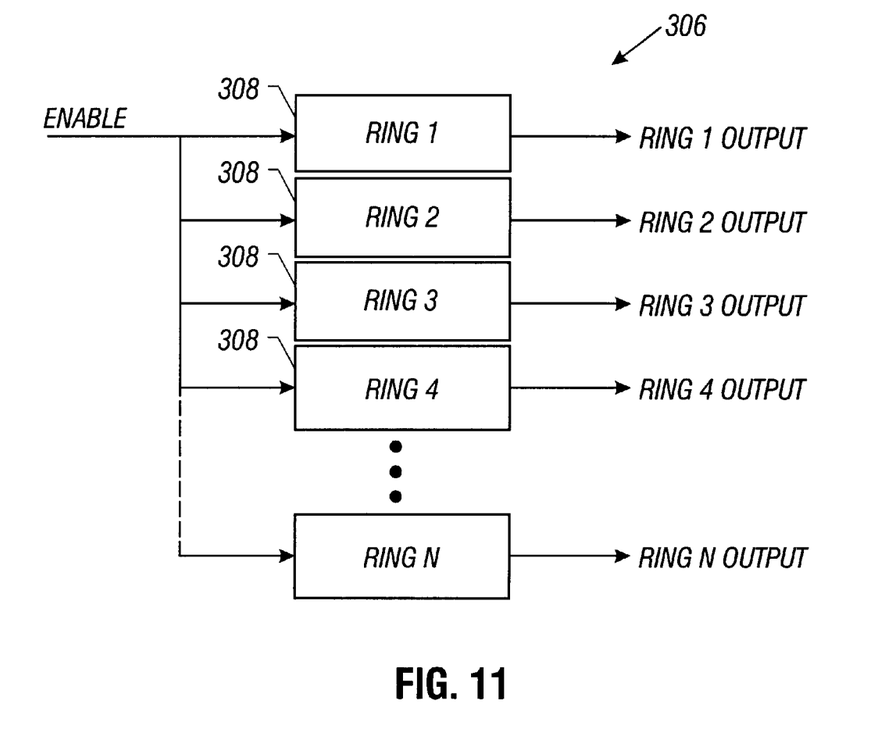

Each ring oscillator 308 in the peripheral group 306 may be constructed to be sensitive to one or more process parameters to which the ring oscillators 302 of the elemental group 300 are not sensitive. By comparing the frequencies of the two groups 300 and 306, additional metrics and process parameters may be extracted.

Thus, the above-described technique may include one or more of the following advantages. Post-production examination of process metrics may be obtained. A mathematical technique may be used to extract process metrics from ring oscillators. Other and different advantages are possible.

Figure 12:
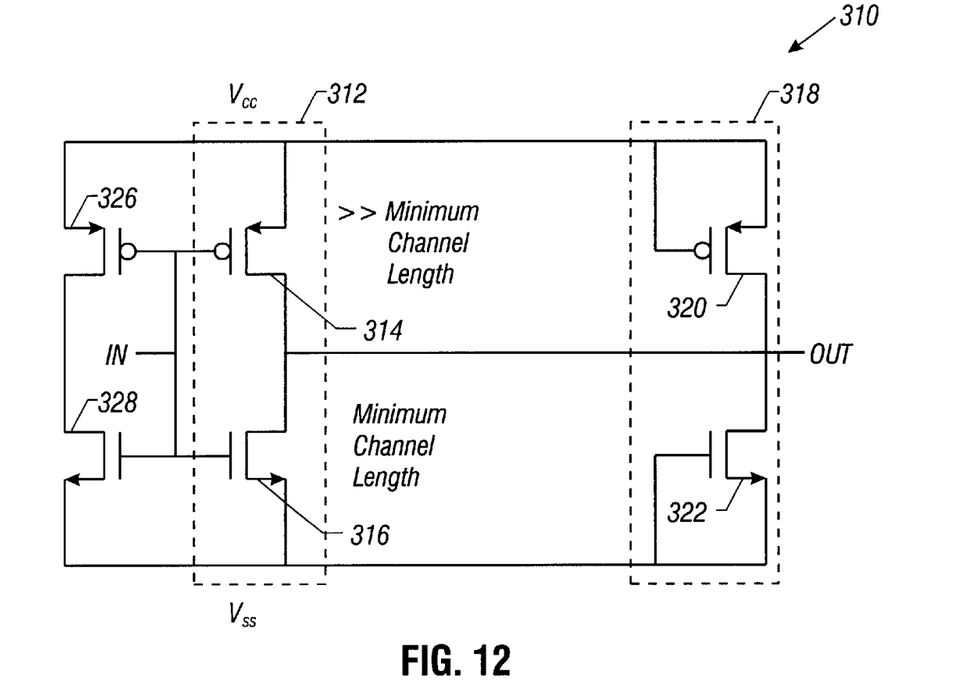
FIG. 12 is a schematic diagram of an inverter of one type of ring oscillator that is sensitive to process parameters that affect n-channel devices.

In some embodiments of the invention, an inverter circuit 310 that is depicted in FIG. 12 may be used to form an inverter of the ring oscillator. In particular, the inverter circuit 310 includes a complementary metal-oxide-semiconductor (CMOS) inverter that is formed from a p-channel metal-oxide-semiconductor field-effect-transistor (PMOSFET) 314 and an n-channel MOSFET (NMOSFET) 316. The inverter circuit 310 may also include circuitry 318 that adds output capacitances via a PMOSFET 320 and an NMOSFET 322. Additionally, the inverter circuit 310 may include a mirroring CMOS inverter that is formed from a PMOSFET 326 and an NMOSFET 328 and has its input coupled to the input of the other CMOS inverter.

As depicted in FIG. 12, to cause the inverter circuit 310 to be sensitive to variations in the n-type process parameters, the NMOSFETs 316 and 328 have a minimum channel length, and the PMOSFETs 314 and 326 have a channel length much greater than the minimum channel length. Therefore, the inverter circuit 310 exhibits substantial sensitivity to n-type process parameters.

Figure 13:
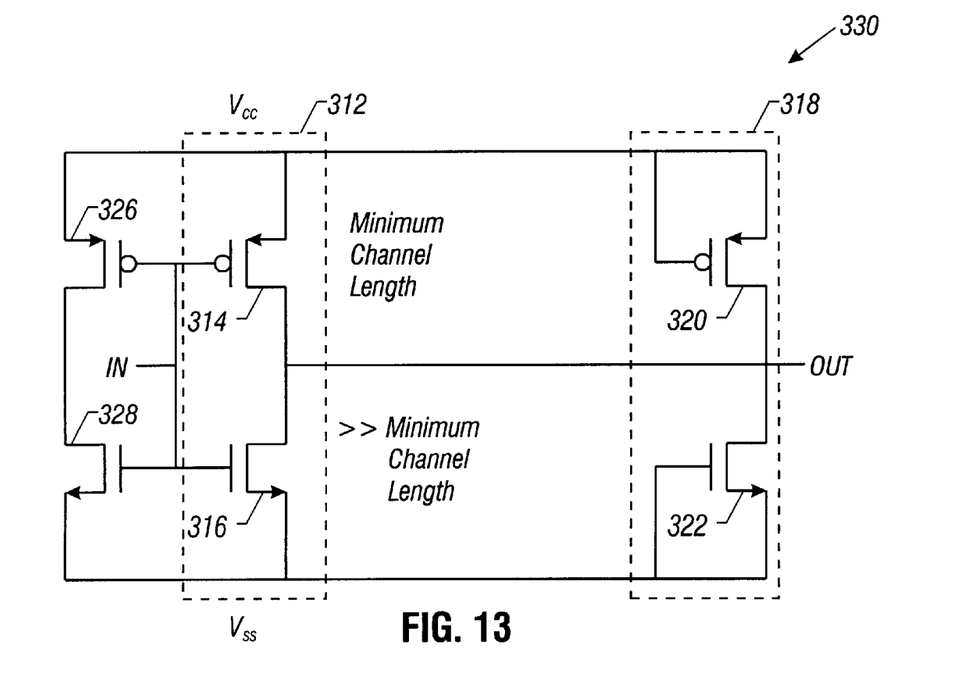
FIG. 13 is a schematic diagram of an inverter of one type of ring oscillator that is sensitive to process parameters that affect p-channel devices.

The Ring B ring oscillator 302 may include inverter circuits 330, one of which is depicted in FIG. 13. In this manner, the inverter circuit 330 has a similar design to the inverter circuit 310, except for the following differences. In particular, the NMOSFETs 316 and 328 have channel lengths that are much greater than the minimum channel lengths. However, the PMOSFETs 314 and 326 each have a channel length that is near the minimum p-channel length. As a result of this arrangement, the inverter circuit 330 (and thus, the Ring B ring oscillator 302) is substantially sensitive to p-type process parameters.

Figure 14:
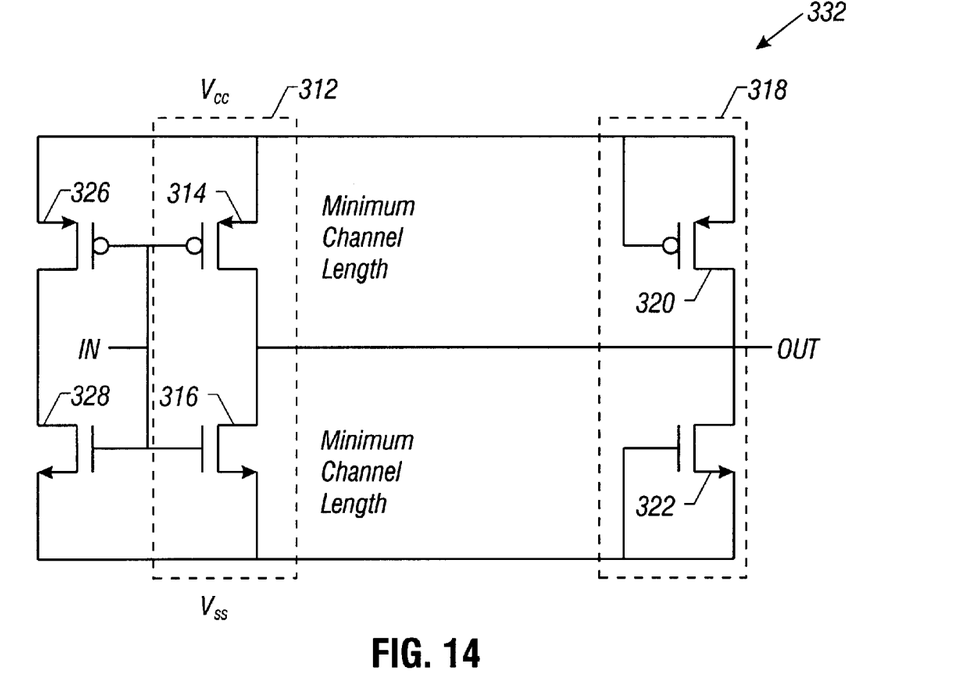
FIG. 14 is a schematic diagram of an inverter of one type of ring oscillator that is sensitive to process parameters that affect both p-channel and n-channel devices.

The Ring C ring oscillator 302 may be formed from inverter circuits 332, one of which is depicted in FIG. 14. In the inverter circuit 332, each of the NMOSFETs 316 and 328 and each of the PMOSFETs 314 and 326 have minimum channel lengths. Due to this arrangement, the inverter circuit 332 is sensitive to both p-type and n-type process parameters.

Figure 15:
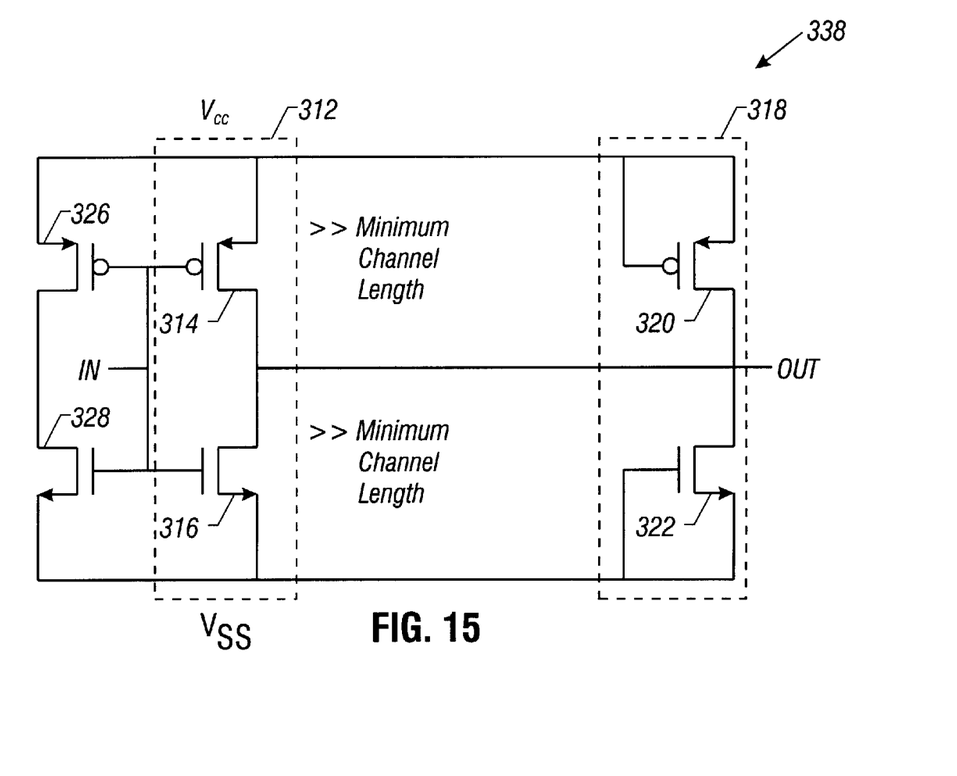
FIG. 15 is a schematic diagram of an inverter of one type of ring oscillator that is not sensitive to process parameters that may affect either n-channel devices or p-channel devices.

FIG. 15 depicts an inverter circuit 338 for the Ring D ring oscillator 302. Each of the NMOSFETs 316 and 328 and each of the PMOSFETs 314 and 326 have channel lengths that are substantially greater than the respective minimum n-channel and p-channel lengths. Therefore, the inverter circuit 338 (and thus, the Ring D ring oscillator 302) does not substantially vary with respect to p-type and n-type process parameter variations.

Other embodiments are within the scope of the following claims. For example, other characteristics and sensitivities to process parameters may be evaluated using the above-described techniques. As a more specific example, the sensitivity to the use of a single NMOSFET in a CMOS inverter to the use of two NMOSFETs (that have their drain-source paths coupled in series and replace the single NMOSFET) in a CMOS inverter may be measured using the above-described techniques.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. An apparatus comprising:
   a first circuit fabricated on a semiconductor substrate to generate a first oscillating signal that propagates through the first circuit, the first oscillating signal having a frequency dependent on at least in part a parameter of a process used to fabricate the first circuit;
   a second circuit fabricated on the semiconductor substrate near the first circuit to generate a second oscillating signal that propagates through the second circuit, a phase relationship existing between the first and second oscillating signals at adjacent points of the first and second circuits; and
   a third circuit coupled to the first and second circuits to regulate logical state transitions in the first and second oscillating signals to cause the phase relationship to be near a predetermined value.

2. The apparatus of claim 1, wherein the predetermined value is approximately one hundred eighty degrees.

3. The apparatus of claim 1, wherein the predetermined value is approximately zero degrees.

4. The apparatus of claim 1, wherein the third circuit comprises:
   a first flip-flop to regulate the logical state transitions of the first oscillating signal; and
   a second flip-flop to regulate the logical state transitions of the second oscillating signal.

5. The apparatus of claim 1, wherein the circuit comprises:
   logic to detect edge transitions in at least one of the first and second oscillating signals.

6. The apparatus of claim 1, wherein the first circuit and the third circuit in combination form a ring oscillator.

7. The apparatus of claim 1, wherein at least one of the first and second circuits comprises:

a chain of inverters.

8. The apparatus of claim 1, wherein the first circuit comprises a first chain of at least one inverter, the second circuit comprises a second chain of at least one inverter, and the first chain has a different number of inverters than the second chain.

9. A test apparatus comprising:

a first oscillator fabricated in a semiconductor substrate to generate a first oscillating signal, a frequency of the first oscillating signal being substantially influenced by a first process parameter of the substrate and not being substantially influenced by a second process parameter of the substrate; and a second oscillator fabricated in the semiconductor substrate to generate a second oscillating signal, a frequency of the second oscillating signal being substantially influenced by the second process parameter and not being substantially influenced by the first process parameter.

10. The test apparatus of claim 9, wherein the first process parameter comprises a n-device process parameter and the second process parameter comprises a p-device parameter.

11. The test apparatus of claim 9, further comprising:

a third oscillator fabricated in the semiconductor substrate to generate a third oscillating signal, a frequency of the third oscillating signal not being substantially influenced by the first and second process parameters.

12. The test apparatus of claim 9, wherein the first and second oscillators are located adjacent to each other.

13. The test apparatus of claim 9, further comprising:

at least one counter to measure at least one of the first and second frequencies.

14. The test apparatus of claim 9, wherein at least one of the first and second oscillators comprises a ring oscillator.

15. A method comprising:

fabricating a first circuit in a semiconductor substrate;

fabricating a second circuit in the semiconductor substrate;

using the first circuit to generate a first oscillating signal;

using the second circuit to generate a second oscillating signal; and regulating the generation of the first oscillating signal and regulating the generation of the second oscillating signal to establish a phase relationship between the signals, wherein the first oscillating signal has a frequency that is a function of one or more process parameters that characterize a process used to fabricate the first circuit.

16. The method of claim 15, wherein the generation of at least one of the first and second oscillating signals includes using a ring oscillator.

17. The method of claim 15, wherein the regulating comprises:

synchronizing edges of the first and second oscillating signals.

18. A method comprising:

generating a first oscillating signal, a frequency of the first oscillating signal being substantially influenced by a first process parameter of a substrate and not being substantially influenced by a second process parameter of the substrate;

generating a second oscillating signal, a frequency of the second oscillating signal being substantially influenced by a second process parameter and not being substantially influenced by the first process parameter; and using the first and second oscillating signals to extract at least one of the first and second process parameters.

19. The method of claim 18, wherein the first process parameter comprises a n-type process parameter and the second process parameter comprises a p-type process parameter.

20. The method of claim 18, further comprising:

obtaining a measure of the first and second frequencies to extract at least one of the first and second process parameters.

21. The method of claim 18, further comprising:

generating a third oscillating signal, a frequency of the third oscillating signal not being substantially influenced by the first process parameter of the substrate and not being substantially influenced by the second process parameter.

22. The method of claim 21, further comprising:

using the first, second and third oscillating signals to extract at least one of the first and second process parameters.

* * * * *